United States Patent [19]

Kee

[11] Patent Number: 5,308,797
[45] Date of Patent: May 3, 1994

[54] LEADS FOR SEMICONDUCTOR CHIP ASSEMBLY AND METHOD

[75] Inventor: David R. Kee, Richardson, Tex.

[73] Assignee: Texas Instruments Incorporated, Dallas, Tex.

[21] Appl. No.: 980,824

[22] Filed: Nov. 24, 1992

[51] Int. Cl.⁵ .......................................... H01L 21/60
[52] U.S. Cl. .................................. 437/209; 437/206; 437/211; 437/217; 437/220
[58] Field of Search ............... 437/209, 217, 220, 206, 437/211

[56] References Cited

U.S. PATENT DOCUMENTS

| | | | |
|---|---|---|---|
| 4,994,411 | 2/1991 | Naito et al. | 437/209 |
| 5,008,997 | 4/1991 | Phy | 437/209 |
| 5,066,614 | 11/1991 | Dunaway | 437/217 |
| 5,079,190 | 1/1992 | Mihara | 437/220 |
| 5,086,018 | 2/1992 | Conru et al. | 437/220 |
| 5,095,361 | 3/1992 | Iwata | 437/217 |

Primary Examiner—Brian E. Hearn
Assistant Examiner—Kevin Picardat
Attorney, Agent, or Firm—Peter T. Rutkowski; Richard L. Donaldson

[57] ABSTRACT

A semiconductor device is formed without using a leadframe. A semiconductor device is formed in one area of a semiconductor chip and a second area includes conductors to which lead wires are bonded. The lead wires are used for mounting the semiconductor device.

10 Claims, 2 Drawing Sheets

LEADS FOR SEMICONDUCTOR CHIP ASSEMBLY AND METHOD

FIELD OF THE INVENTION

This application relates to semiconductor devices, and more particularly to a semiconductor device that has the leads mounted on and attached to the semiconductor chip.

BACKGROUND OF THE INVENTION

Semiconductor devices and integrated circuit devices in particularly usually have a semiconductor chip mounted on a lead frame. After attaching the semiconductor chip to the lead frame the device is encapsulated. A large portion of the lead frame is then removed leaving individual leadframe leads attached to the contact areas of the chip.

Various techniques have been used in attaching leads to a semiconductor device. In one process, a small bond pad is utilized to attach the semiconductor chip to a larger lead frame which subsequently get trimmed leving only the leads. Tape Automated Bonding (TAB) uses a carrier ring to permit mass bonding of devices, and then each the device is excised from the carrier ring and the leads trimmed and formed. In the Flip chip process, the semiconductor device or chip is bonded to another substrate using bump contacts grown or plated on the device and then reflowed to attach the device to the other substrate.

Lead frames add to the expense of packaging in that most of the lead frame is removed and the devices require encapsulating to keep the leads in place. In the TAB process there is the expense of growing bump contacts on the surface of the device and the cost of the tape to bond to the bumps. Most of the tape is cut away and is not used.

SUMMARY OF THE INVENTION

The invention is to a semiconductor device and the method of making which includes mounting and attaching the lead wires directly on a portion of the semiconductor chip. The semiconductor chip is enlarged to allow formation of a suitable large bond pad that is used to bond a wire to the bond pad, and to form the wire into a lead. Bonding may be by, for example, by ultrasonically welding.

The invention eliminates a majority of the processing steps normally used in assembling semiconductor device. A continuous wire feeding is used for lead formation. One end of the wire is bonded to the bond pad and then formed and cut to length. No wire is wasted.

The device does not have to be encapsulated in it entirety. A glass surface passivation over the active area of the device and a part of the leads eliminates the need for plastic encapsulation. Non Corrosive metallization on the bond pads protects the welded leads from corrosion.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
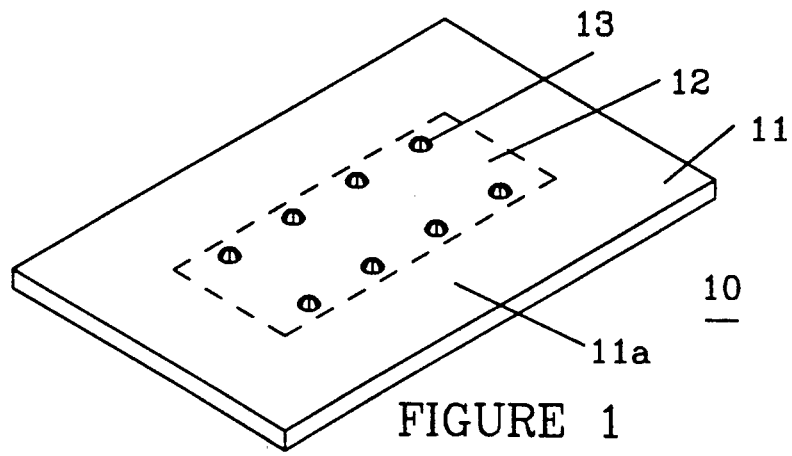
FIG. 1 shows a semiconductor chip having a semiconductor device formed thereon.

FIG. 1 illustrates a semiconductor device 10 having an active area 12 which is the actual device, and a periphery area 11 of the material of the semiconductor device, for example, silicon. Device 10 may include an active area 12 which is an integrated circuit having a plurality of contacts 13. Contacts 13 provide contacts areas to the functional areas of the integrated circuit including, but not limited to voltage and ground contacts, signal input and output contacts and other control contacts.

Figure 2:
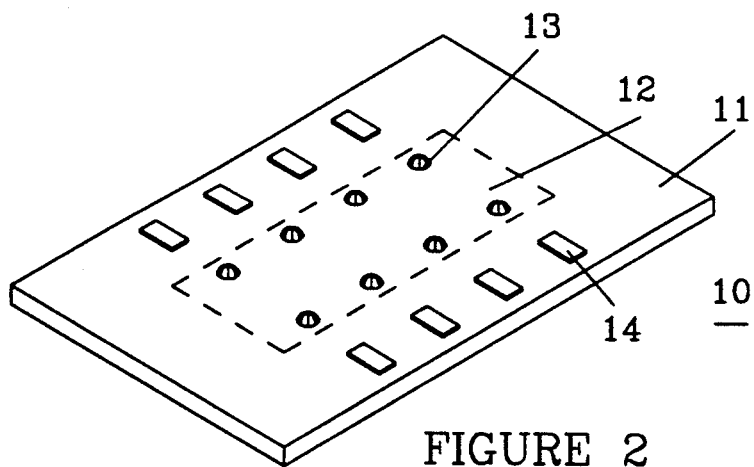
FIG. 2 shows the chip of FIG. 1 with lead bond pads formed thereon.

FIG. 2 shows the semiconductor device 10 of FIG. 1 with the addition of conductors 14. There are generally the same number of conductors 14 as there are contacts 13 on the active area 12 of the device. Conductors 14 are, for example, conductors deposited on the wafer and connected to the contacts 13 on the active surface of the device. There may be many interconnections formed (not illustrated) on the surface of an integrated circuit, interconnecting various components formed in the integrated circuit, but of the many interconnections, only a few are needed to connected the integrated circuit to external circuitry. Conductors 14 may be deposited at the same time as the interconnections, and are electrically connected to contacts 13. Conductors 14 are of a non corrosive metal, or of a conducting metal having a noncorrosive metal layer thereon. Peripheral area 11 is either a nonconducting area or has a layer of material thereon to prevent electrical conduction between conductors 14 and the active area 12 of the semiconductor device 10. In FIG. 2, only the outline of the device active is shown, and conductors 14. The surface of device 10 is encapsulated with a encapsulant such as glass or a plastic encapsulant, leaving only conductors 14 exposed.

Figure 3:
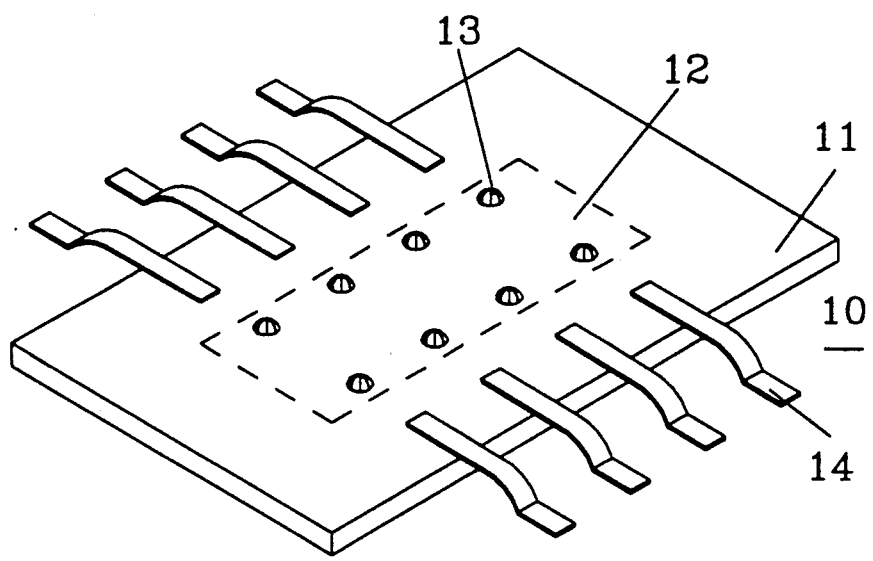
FIG. 3 shows the chip of FIG. 2 with lead wires attached.

FIG. 3 shows device 10 of FIG. 2 with leads 15 bonded to conductors 14. Each lead 15 is connected to a conductor 14. Lead wires 15 correspond to leadframe fingers that would be attached to device 10 if a lead frame were used to supply leads to device 10. Leads 15 may be a wire or metal ribbon that is welded to conducting pad 14. Lead wires 15 may be ultrasonically welded to conductors 14 and then formed into a suitable lead form. The shaping of lead 15 is accomplished at the time of bonding lead 15 to a conductor 14. Leads 15 are shaped and then cut to length.

As pointed out with reference to FIG. 2, the surface of the device, areas 11 and 12, may be coated with a glass passivation material, encapsuling the device. Coating only the surface of the device 10 eliminates the expense of total encapsulation, and provides a thinner, smaller device.

What is claimed is:

1. A method of making a semiconductor device with leads formed directly on the semiconductor chip, comprising the steps of:

forming a semiconductor device with bond pads thereon in a central conductive area of a semiconductor chip leaving a peripheral area of non-conductive semiconductor material that is electrically separate from the semiconductor device;

forming a plurality of conductors on said non-conductive peripheral area around said centrally located semiconductor device, said conductors being electrically connected to said semiconductor device;

bonding and forming a lead wire from a continuous wire feed source to each of said conductors; and cutting said formed lead wire to length.

2. The method according to claim 1, including the step of forming the lead wire to a desired shape during said bonding step.

3. The method according to claim 1, including the step of coating the surface of the semiconductor chip with a passivation material to encapsulate the semiconductor device.

4. The method according to claim 1, wherein said plurality of conducts are of a noncorrosive material.

5. The method according to claim 1, wherein said lead wire is ultrasonically bonded to said conductor.

6. A method of making a semiconductor device with leads formed directly on the semiconductor chip, comprising the steps of:

forming a semiconductor device with bond pads thereon in a first conductive area of a semiconductor chip leaving a second non-conductive area of semiconductor material that is separate from the semiconductor device;

forming a plurality of conductors on said second non-conductive area adjacent said first area, and electrically connecting them to the bond pads on said semiconductor device;

electrically connecting and forming a lead wire to each conductor on said second area of said semiconductor chip; and encapsulating only the top surface of the device.

7. The method according to claim 6, including the step of forming the lead wire to a desired shape during said bonding step.

8. The method according to claim 6, including the step of coating the surface of the semiconductor chip with a passivation material to encapsulate the semiconductor device.

9. The method according to claim 6, wherein said conductors are of a noncorrosive material.

10. The method according to claim 6, wherein said lead wire is ultrasonically bonded to said conductors.

* * * * *